(12) United States Patent
Tsuda et al.

(10) Patent No.: US 6,452,216 B1
(45) Date of Patent: Sep. 17, 2002

(54) NITRIDE SEMICONDUCTOR LIGHT EMITTING DEVICE AND APPARATUS INCLUDING THE SAME

(75) Inventors: Yuhzoh Tsuda; Takayuki Yuasa; Shigetoshi Ito; Mototaka Taneya, all of Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/952,845

(22) Filed: Sep. 11, 2001

(30) Foreign Application Priority Data

Nov. 13, 2000 (JP) ........................................ 2000-344847

(51) Int. Cl.[7] .............................................. H01L 33/00
(52) U.S. Cl. .......................................... 257/94; 257/97
(58) Field of Search ...................................... 257/94, 97

(56) References Cited

U.S. PATENT DOCUMENTS 6,153,010 A  * 11/2000 Kiyoku et al. ................. 117/95
6,329,667 B1 * 11/2001 Ota et al. ....................... 257/13
6,335,546 B1 *  1/2002 Tsuda et al. ................... 257/94
6,365,921 B1 *  4/2002 Watanabe et al. ............. 257/97

FOREIGN PATENT DOCUMENTS

JP          2000124500 A       4/2000

* cited by examiner

*Primary Examiner*—Olik Chaudhuri
*Assistant Examiner*—William C Veserman
(74) *Attorney, Agent, or Firm*—Morrison & Foerster LLP

(57) ABSTRACT

A nitride semiconductor light emitting device includes a worked substrate including grooves and lands formed on a main surface of a nitride semiconductor substrate, a nitride semiconductor underlayer covering the grooves and the lands of the worked substrate and a nitride semiconductor multilayer emission structure including an emission layer including a quantum well layer or both a quantum well layer and a barrier layer in contact with the quantum well layer between an n-type layer and a p-type layer over the nitride semiconductor underlayer, while the width of the grooves is within the range of 11 to 30 $\mu$m and the width of the lands is within the range of 1 to 20 $\mu$m.

11 Claims, 10 Drawing Sheets

EXEMPLARY SECTIONAL VIEW OF WORKED SUBSTRATE

EXEMPLARY TOP PLAN VIEW OF WORKED SUBSTRATE

NITRIDE SEMICONDUCTOR LASER DEVICE
HAVING RIDGE STRIPE STRUCTURE

NITRIDE SEMICONDUCTOR LASER DEVICE HAVING
CURRENT BLOCKING LAYER STRUCTURE

NITRIDE SEMICONDUCTOR LIGHT EMITTING DEVICE AND APPARATUS INCLUDING THE SAME

BACKGROUND OF THE INVENTION

1. Field of the Invention

The present invention relates to a nitride semiconductor light emitting device having an improved emission life and an apparatus including the same.

2. Description of the Prior Art

Japanese Patent Laying-Open No. 2000-124500 discloses a technique of forming convex portions on a GaN layer stacked on a sapphire substrate, flatly covering the convex portions with a GaN underlayer and forming a gallium nitride semiconductor laser device on the GaN covering layer for improving the emission characteristics of a nitride semiconductor light emitting device. According this gazette, the distance between adjacent ones of the convex portions is preferably within the range of 1 to 10 $\mu$m, the width of the upper surfaces of the convex portions is preferably at least 1 $\mu$m, and the height of the convex portions is preferably within the range of 0.1 to 2 $\mu$m. This gazette also describes that the sapphire substrate may be replaced with a GaN substrate.

Even if the sapphire substrate is replaced with a GaN substrate in the nitride semiconductor laser device according to the prior art, however, the oscillation life is still insufficient.

SUMMARY OF THE INVENTION

Accordingly, a principal object of the present invention is to provide a nitride semiconductor light emitting device having a long oscillation life.

According to the present invention, the nitride semiconductor light emitting device includes a worked substrate including grooves and lands formed on a main surface of a nitride semiconductor substrate, a nitride semiconductor underlayer covering the grooves and the lands of the worked substrate and a nitride semiconductor multilayer emission structure including an emission layer including a quantum well layer or both a quantum well layer and a barrier layer in contact with the quantum well layer between an n-type layer and a p-type layer over the nitride semiconductor underlayer, while width of the grooves is within the range of 11 to 30 $\mu$m and width of the lands is within the range of 1 to 20 $\mu$m.

The width of the grooves is preferably larger than the width of the lands, and the depth of the grooves is preferably within the range of 1 to 10 $\mu$m.

The longitudinal direction of the grooves or the longitudinal direction of the lands is preferably substantially parallel to the <1-100> direction or the <11-20> direction of a crystal of the substrate.

The nitride semiconductor underlayer preferably contains Al. Further, the nitride semiconductor underlayer preferably contains $In_xGa_{1-x}N$ ($0.01 \leq x \leq 0.18$).

The quantum well layer preferably contains at least any of As, P and Sb.

The aforementioned nitride semiconductor light emitting device can be either a laser device or a diode device. Further, such a light emitting device can be preferably employed in an optical apparatus or a semiconductor light emitting apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Before describing various embodiments according to the present invention, the meanings of some terms are now clarified.

Figure 2A:
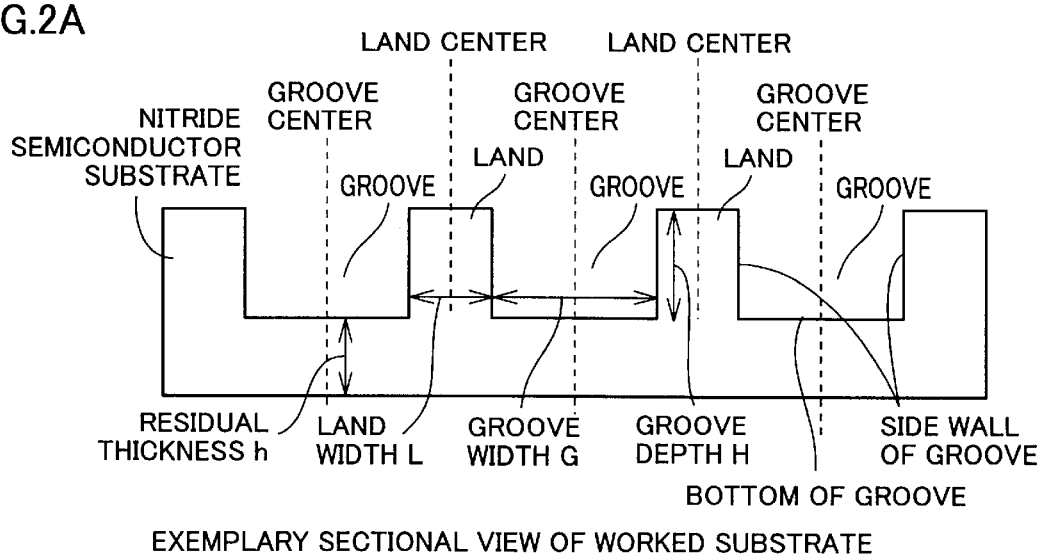
FIG. 2A is a schematic sectional view showing an exemplary nitride semiconductor worked substrate employable in the present invention.
Figure 2B:
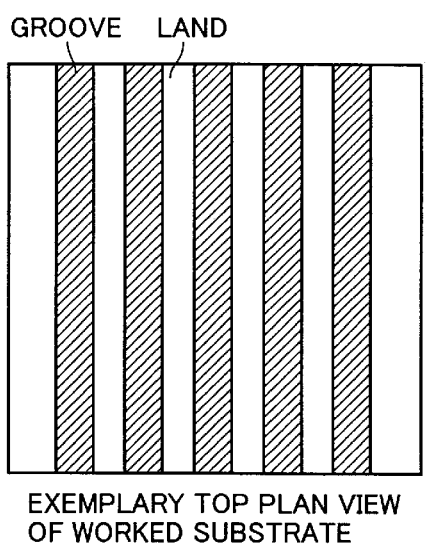
FIG. 2B is a top plan view thereof.

First, the term "grooves" stands for striped concave portions formed on a main surface of a nitride semiconductor substrate, and the term "lands" similarly stands for striped convex portions (see FIGS. 2A and 2B, for example). The grooves and the lands may not necessarily have rectangular sectional shapes as shown in FIG. 2A, but may simply define steps of unevenness. In the accompanying drawings, lengths, widths, thicknesses and depths are arbitrarily changed for simplifying and clarifying the drawings, and do not show actual dimensional relation.

The term "nitride semiconductor substrate" stands for a substrate containing $Al_xGa_yIn_zN$ ($0 \leq x \leq 1$; $0 \leq y \leq 1$; $0 \leq z \leq 1$; and $x+y+z=1$). Not more than about 10% of the nitrogen element contained in this nitride semiconductor substrate may be replaced with at least one of As, P and Sb (on the premise that the hexagonal crystal system of the substrate is maintained). At least any of impurities Si, O, Cl, S, C, Ge, Zn, Cd, Mg and Be may be added to the nitride semiconductor substrate. In order to provide the nitride semiconductor substrate with n-type conductivity, Si, O and Cl are particularly preferable among these impurities.

The term "nitride semiconductor underlayer" stands for a nitride semiconductor film covering a worked substrate, which contains $Al_xGa_yIn_zN$ ($0 \leq x \leq 1$; $0 \leq y \leq 1$; $0 \leq z \leq 1$; and $x+y+z=1$). Similarly to the case of the nitride semiconductor substrate, not more than about 10% of the nitrogen element contained in this nitride semiconductor underlayer may be replaced with at least one of As, P and Sb, and at least any of impurities Si, O, Cl, S, C, Ge, Zn, Cd, Mg and Be may be added to the nitride semiconductor underlayer.

The term "worked substrate" stands for a nitride semiconductor substrate having a main surface formed with grooves and lands. The widths of the grooves and the lands may have a constant periodicity or may be different from each other. All grooves may have a constant depth, or the grooves may have different depths.

The term "emission layer" stands for a layer including at least one quantum well layer or a plurality of barrier layers alternately stacked with such a quantum well layer. An emission layer of a single quantum well structure is formed by only a single well layer or a barrier layer, a well layer and a barrier layer stacked with one another. An emission layer of a multilayer quantum well structure includes a plurality of well layers and a plurality of barrier layers alternately stacked with one another, as a matter of course.

The term "light emitting device structure" stands for a structure including the emission layer as well as an n-type layer and a p-type layer holding the same therebetween. The term "covered worked substrate" stands for an improved substrate including the worked substrate and the underlayer consisting of a nitride semiconductor film covering the same (see FIG. 3).

[First Embodiment]

The worked substrate of a nitride semiconductor employed in the present invention includes grooves and lands formed on a main surface thereof. The width G of the grooves formed on the worked substrate must be within the range of 11 to 30 $\mu$m, and the width L of the lands must be within the range of 1 to 20 $\mu$m. The restrictive range of such widths of the grooves and the lands is hereinafter referred to as a groove-land width range A. According to the present invention, the characteristics of the nitride semiconductor light emitting device are improved by employing a nitride worked substrate having the groove-land width range A, so that the life of a nitride semiconductor laser device can be increased or the emission intensity of a nitride semiconductor light emitting diode device can be improved, for example.

The groove-land width range A is effective only in a worked substrate consisting of a nitride semiconductor. This is because a nitride semiconductor underlayer grown on a worked substrate consisting of a material other than the nitride semiconductor (hereinafter referred to as a hetero worked substrate) is subjected to stress strain stronger than that applied to a nitride semiconductor underlayer grown on the worked substrate of the nitride semiconductor. Even if a hetero worked substrate having the groove-land width range A is prepared, crystal strain in a nitride semiconductor underlayer covering the hetero worked substrate is not relaxed dissimilarly to the case of employing the worked substrate of the nitride semiconductor.

(As to Groove-Land Width Range A)

Figure 5:
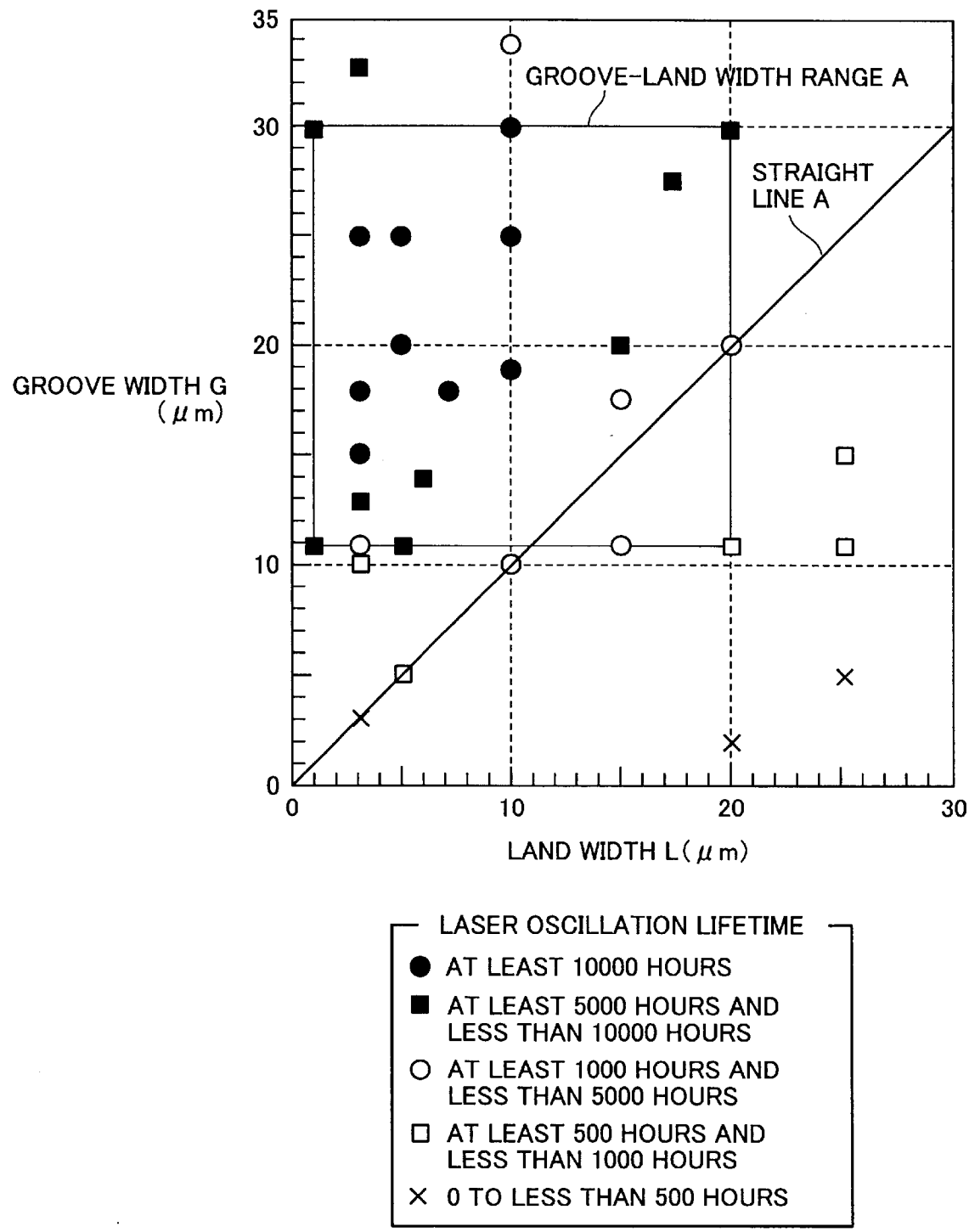
FIG. 5 is a graph showing a groove-land width range A required in the worked substrate employed in the present invention.

The inventors have investigated influences exerted by the groove width G and the land width L on the laser oscillation life. FIG. 5 shows the results. Referring to FIG. 5, the horizontal axis shows the land width L ($\mu$m) and the vertical axis shows the groove width G ($\mu$m). Black circles show laser oscillation lives of at least 10000 hours, black squares show laser oscillation lives of at least 5000 hours and less than 10000 hours, white circles show laser oscillation lives of at least 1000 hours and less than 5000 hours, white squares show laser oscillation lives of at least 500 hours and less than 1000 hours, and crosses show laser oscillation lives of less than 500 hours. The structure of nitride semiconductor laser devices subjected to this measurement and a method of manufacturing the same were similar to those of nitride semiconductor laser devices according to a sixth embodiment of the present invention described later.

As understood from FIG. 5, the groove width G and the land width L substantially satisfying laser oscillation lives of at least 5000 hours (black circles and black squares) of the nitride semiconductor laser device were at least about 11 $\mu$m and not more than 30 $\mu$m and at least about 1 $\mu$m and not more than 20 $\mu$m (within the groove-land width range A in FIG. 5) respectively. More strictly, it was possible to prepare a nitride semiconductor laser device having a laser oscillation life of at least 5000 hours even when the groove width G was larger than 30 $\mu$m. If the groove width G exceeds 30 $\mu$m, however, the grooves are hardly completely filled up with the nitride semiconductor underlayer. When the grooves are hardly covered with the nitride semiconductor underlayer, the area allowing formation of the nitride semiconductor laser device is narrowed unpreferably in consideration of an acquisition ratio of nitride semiconductor laser devices per wafer.

When the widths of the grooves and the lands formed on the worked substrate were within the groove-land width range A and belonged to the upper left area of FIG. 5 divided by a straight line A, the acquisition ratio of nitride semiconductor laser device chips having laser oscillation lives of at least 5000 hours (black circles and black squares) was increased. This proves that it is important to increase the groove width G beyond the land width L for improving the laser oscillation life.

When the widths of the grooves and the lands formed on the worked substrate were within the groove-land width range A and the land width L was not more than 10 $\mu$m, the acquisition ratio of nitride semiconductor laser device chips having laser oscillation lives of at least 10000 hours (black circles) was increased much.

The inventors have further discovered that a cracking ratio in the laser device chip can also be suppressed when the widths of the grooves and the lands formed on the worked substrate belong to the groove-land width range A. In general, it has been regarded that a nitride semiconductor laser device formed on a GaN substrate is hardly cracked. In practice, however, a conventional GaN substrate is remarkably cracked after formation of a nitride semiconductor laser device thereon. This is conceivably because the nitride semiconductor laser device is formed by a multilayer structure of various layers (for example, an AlGaN layer has a smaller lattice constant than a GaN layer, and an InGaN layer has a larger lattice constant than the GaN layer). It is also conceivable that such cracking is influenced by latency of residual strain in the GaN substrate obtained by the current technique itself.

When a nitride semiconductor laser device was formed on a covered worked substrate (see FIG. 3) structured by the worked substrate and the nitride semiconductor underlayer according to the present invention, however, crack density was within the range of 0 to 3/cm². When a nitride semiconductor laser device was formed on a conventional GaN substrate, crack density was within the range of about 5 to 8/cm².

Thus, not only the laser oscillation life was improved but also the crack density was suppressed according to the present invention, and hence the long life of the nitride semiconductor laser device has probably been obtained by an effect of relaxing crystal strain in the nitride semiconductor crystal. Further, the life of the nitride semiconductor laser device was remarkably increased when the groove width G was increased beyond the land width L, and hence the effect of relaxing crystal strain is conceivably attained mainly by the grooves.

The aforementioned effects of increasing the life and reducing the crack density according to the present invention are not restricted to a nitride semiconductor laser device but similarly attained also in a nitride semiconductor light emitting diode device, as a matter of course.

(As to Groove Depth)

Figure 6:
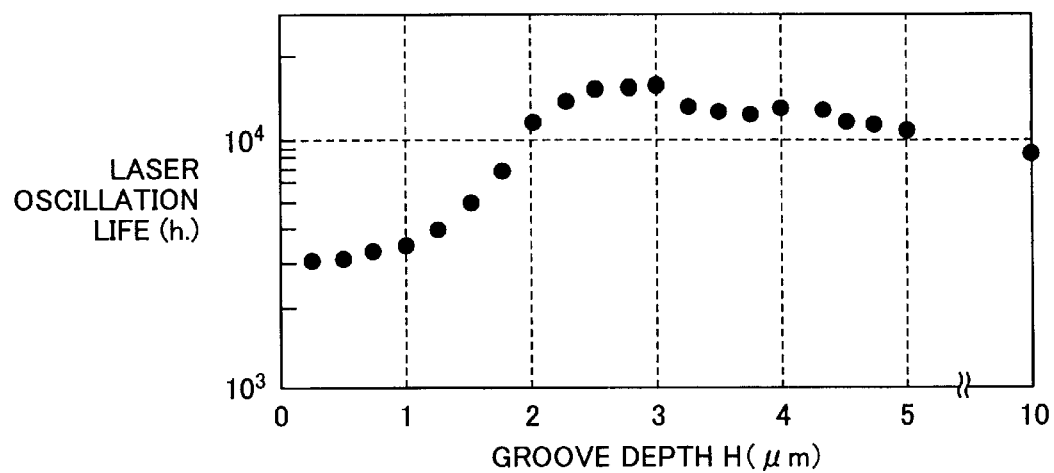
FIG. 6 is a graph showing the relation between a groove depth in the worked substrate employed in the present invention and the oscillation life of a laser device obtained through the worked substrate.

FIG. 6 shows the relation between groove depths H and laser oscillation lives. The structure of nitride semiconductor laser devices subjected to measurement in FIG. 6 and a method of manufacturing the same were similar to those of the sixth embodiment described later, and the groove width G and the land width L were 18 μm and 7 μm respectively, i.e., within the groove-land width range A.

As understood from FIG. 6, the laser oscillation life started to increase as the groove depth H exceeded about 1 μm. When the groove depth H exceeded 2 μm, the laser oscillation life further increased and thereafter reached a substantially constant saturation value. While the upper limit of the groove depth H related to improvement of the laser oscillation life is not particularly restricted, the grooves are hardly covered with the nitride semiconductor underlayer if the groove depth H exceeds about 10 μm. If the grooves are hardly covered with the nitride semiconductor underlayer, the area allowing formation of the nitride semiconductor laser device is reduced unpreferably in consideration of the acquisition ratio of nitride semiconductor laser device chips per wafer. In the present invention, therefore, the groove depth H is preferably at least 1 μm and not more than 10 μm, and more preferably at least 2 μm and not more than 10 μm.

The relation between the groove depth H and the laser oscillation life exhibited a tendency similar to that in FIG. 6 so far as the groove-land width range A was satisfied. The aforementioned relation between the groove depth H and the emission life is not restricted to the nitride semiconductor laser device but is also applicable to a nitride semiconductor light emitting diode device.

(Position for Forming Emission Part)

The inventors have made deep study to discover that the laser oscillation life varies with the position of an emission part (below a ridge stripe portion) of the nitride semiconductor laser device formed on the covered worked substrate.

Figure 7:
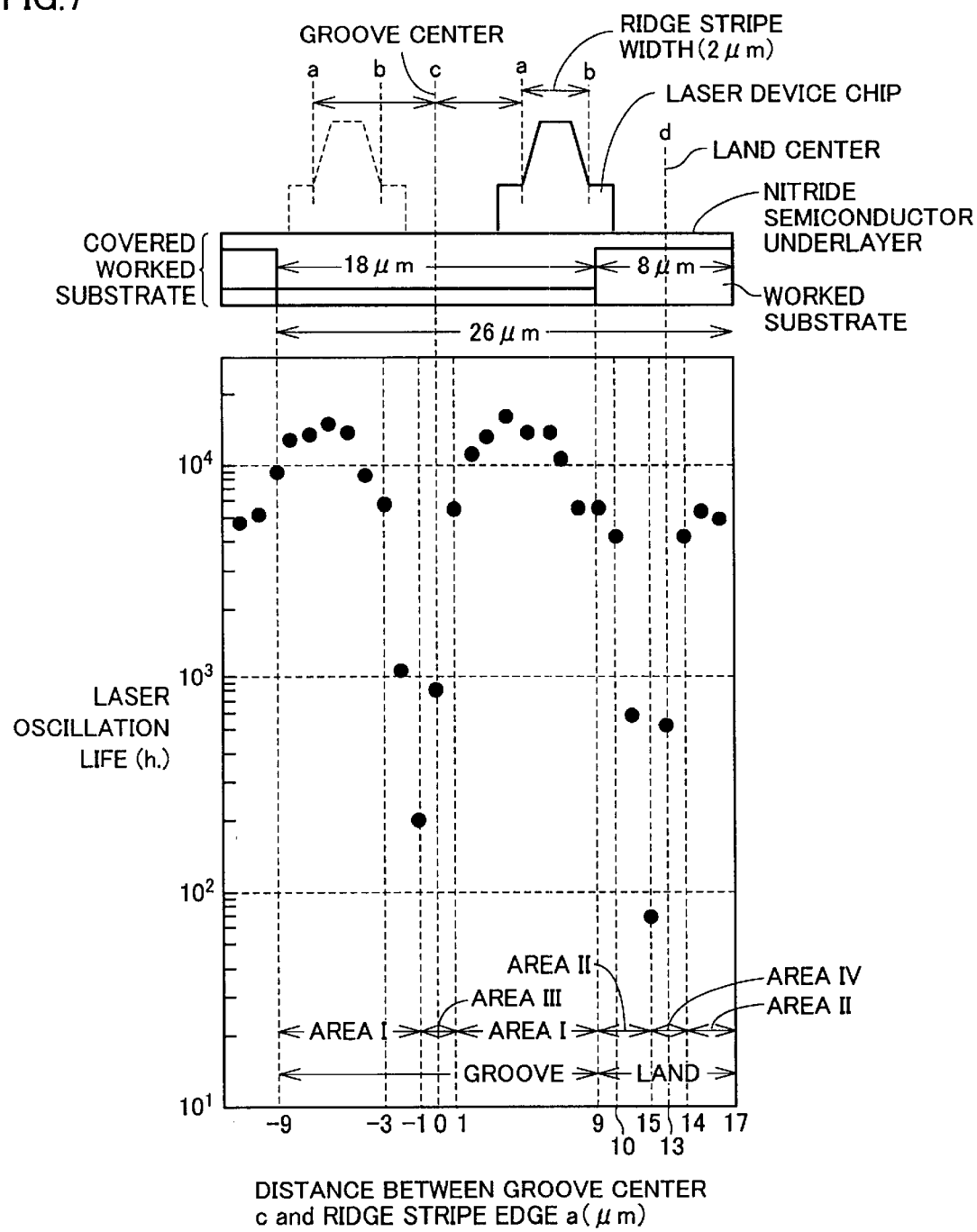
FIG. 7 illustrates the relation between a position for forming a ridge stripe portion of a nitride semiconductor laser device formed on the covered worked substrate employable in the present invention and the laser oscillation life.

Referring to a graph shown in FIG. 7, the horizontal axis shows the distance along the width direction between a ridge stripe edge a and a groove center c of the covered worked substrate, and the vertical axis shows the laser oscillation life. The distance (hereinafter referred to as a c-to-a distance) between the groove center c and the ridge stripe edge a is positive on the right side of the groove center c and negative on the left side of the groove center c along the width direction. The structure of nitride semiconductor laser devices subjected to measurement in FIG. 7 and a method of manufacturing the same were similar to those of the sixth embodiment described later. The ridge stripe width, the groove width G, the land width L and the groove depth H were 2 μm, 18 μm, 8 μm and 2.5 μm, respectively.

As shown in FIG. 7, the laser oscillation life of a nitride semiconductor laser device having a ridge stripe portion formed above the groove exhibited a tendency exceeding that of a nitride semiconductor laser device having a ridge stripe portion formed above the land. As a result of more detailed investigation, it has been proven that the laser oscillation life is remarkably reduced when the ridge stripe portion is formed in an area having a c-to-a distance larger than −3 μm and smaller than 1 μm above the groove. Considering that the width of the ridge stripe portion is 2 μm, a c-to-a distance of −3 μm corresponds to −1 μm in terms of the distance between the groove center c and another ridge stripe edge b (hereinafter referred to as a c-to-b distance). In other words, it has been proven that the laser oscillation life is remarkably reduced when the ridge stripe portion of the nitride semiconductor laser device is formed to be at least partially included in an area of less than 1 μm on the right and the left of the groove center c along the width direction.

The area (in the range of less than 1 μm on the right and the left of the groove center c along the width direction) where the laser oscillation life is remarkably reduced is referred to as an area III. Therefore, the ridge stripe portion of the nitride semiconductor laser device is preferably formed to be entirely (a-b width) included in a range excluding the area III. In the range of the groove width G, the range of at least 1 μm on the right and the left of the groove center c along the width direction is referred to as an area I. This area I allows formation of a nitride semiconductor laser device having a longer laser oscillation life as compared with an area II described below.

Description similar to that for the areas above the groove is applicable to areas above the land. When the ridge stripe portion of the nitride semiconductor laser device was formed on an area presenting a c-to-a distance larger than 10 μm and smaller than 14 μm, the laser oscillation life was remarkably reduced. Considering that the width of the ridge stripe portion is 2 μm, a c-to-a distance of −10 μm corresponds to −1 μm in terms of the distance (hereinafter referred to as a d-to-b distance) between the land center d and the ridge stripe edge b. Similarly, a d-to-a distance of 14 μm corresponds to −1 μm in terms of the distance (hereinafter referred to as a d-to-a distance) between the land center d and the ridge stripe edge a. In other words, it has been proven that the laser oscillation life is remarkably reduced when the ridge stripe portion of the nitride semiconductor laser device is formed to be at least partially included in an area of less than 1 μm on the right and the left of the land center d along the width direction.

The area (in the range of less than 1 μm on the right and the left of the land center d along the width direction) where the laser oscillation life is remarkably reduced is referred to as an area IV. Therefore, the ridge stripe portion of the nitride semiconductor laser device is preferably formed to be entirely (a-b width) included in a range excluding the area IV. In the range of the land width L, a range of at least 1 μm on the right and the left of the land center d along the width direction is referred to as the area II. A nitride semiconductor laser device having a ridge stripe portion formed on this area II exhibited a sufficient laser oscillation life of several 1000 hours, although this life was shorter than that in the aforementioned case of the area I.

Figure 8:
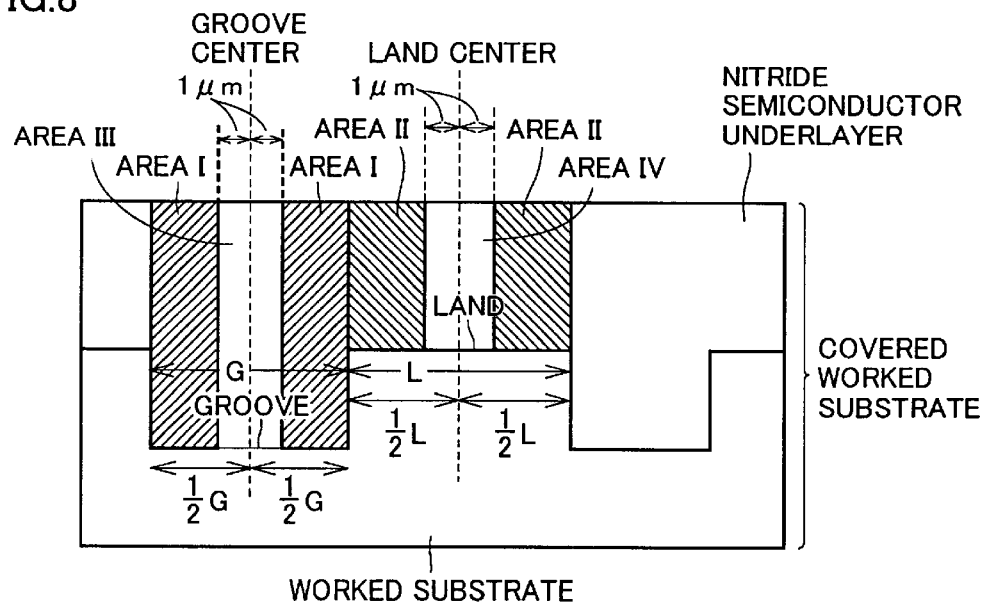
FIG. 8 is a schematic sectional view showing preferable areas for forming a light emitting device structure on the covered worked substrate employable in the present invention.

FIG. 8 is a schematic diagram showing the aforementioned results, i.e., the aforementioned areas I to IV on the covered worked substrate according to the present invention. In the covered worked substrate according to the present invention, the ridge stripe portion of the nitride semiconductor laser device is preferably formed at least on an area (the area I or II) excluding the areas III and IV, most preferably formed on the area I and next-preferably formed on the area II.

It is inferred from the above results that, when the worked substrate having the groove width G and the land width L according to the present invention is covered with the underlayer of the nitride semiconductor film (i.e., on the covered worked substrate), areas of the nitride semiconductor underlayer located on the grooves of the worked substrate have a larger effect of relaxing crystal strain as compared with areas of the underlayer located on the lands.

A nitride semiconductor laser device formed on a covered worked substrate having a groove width G and a land width L belonging to the groove-land width range A according to the present invention can obtain the aforementioned relation between the position for forming the ridge stripe portion and the laser oscillation life. Also when the width of the ridge stripe portion is other than 2 μm, a tendency similar to the relation shown in FIG. 7 is attained.

Figure 12A:
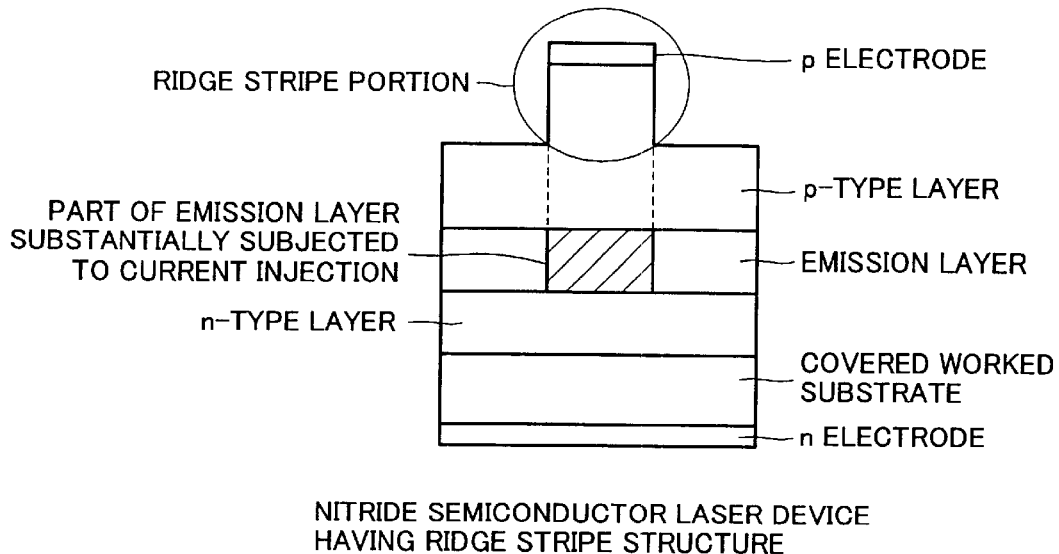
FIG. 12A is a schematic sectional view showing an exemplary nitride semiconductor laser device having a ridge stripe structure.
Figure 12B:
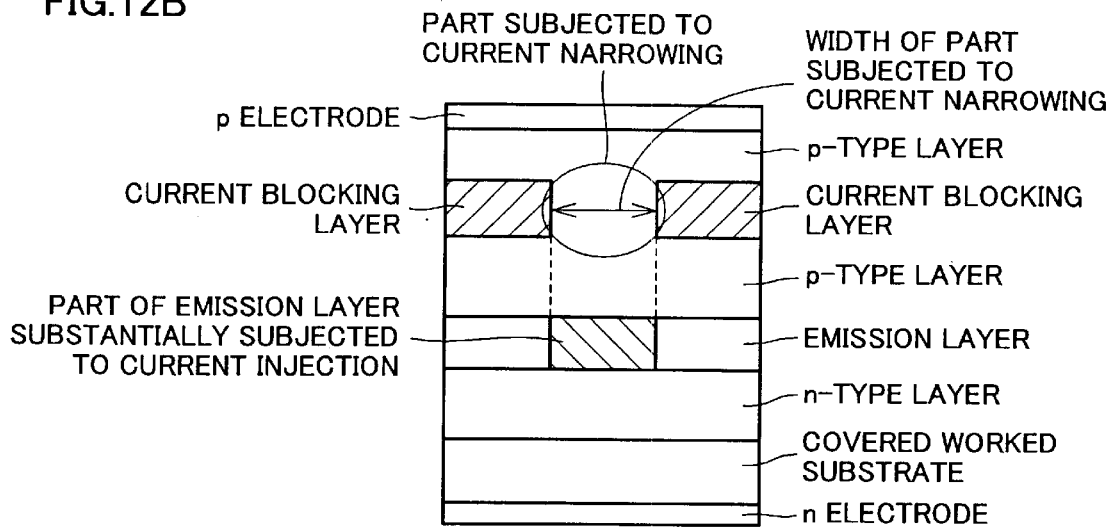
FIG. 12B is a schematic sectional view showing an exemplary nitride semiconductor laser device having a current blocking layer structure.

The aforementioned relation between the position for forming the ridge stripe portion and the laser oscillation life is not restricted to a nitride semiconductor laser device having a ridge stripe structure shown in a schematics sectional view of FIG. 12A, for example. In a nitride semiconductor laser device having a current blocking structure shown in a schematic sectional view of FIG. 12B, for example, the aforementioned ridge stripe portion corresponds to a current narrowing part of the laser device, and the ridge stripe width corresponds to the width of the current narrowing part. In more general expression, the effects according to the present invention are attained when an emission part (substantial current injection part of an emission layer) contributing to laser oscillation of the nitride semiconductor laser device is present on the area I and/or the area II shown in FIG. 8.

In practice, however, the laser oscillation life of the nitride semiconductor laser device having a current blocking structure was lower by about 20 to 30% as compared with the nitride semiconductor laser device having the aforementioned ridge stripe structure. In the nitride semiconductor laser device having a current blocking structure, further, the yield was remarkably reduced by cracking as compared with the nitride semiconductor laser device having a ridge stripe structure. While the causes therefor are uncertain, a step of growing a nitride semiconductor crystal on a current blocking layer formed with a current narrowing part is conceivably problematic. In the step of growing the nitride semi- conductor crystal on the current blocking layer, the wafer is temporarily taken out from a crystal growth apparatus (to normal temperature) to prepare the current narrowing part thereon in the process of preparing a light emitting device structure and thereafter the wafer is introduced into the crystal growth apparatus again to grow the remaining emission structure at about 1000° C., for example. When a heat history including abrupt temperature change is applied in an intermediate stage of forming the light emitting device structure, it is conceivable that crystal strain in the light emitting device structure is not sufficiently relaxed but cracking takes place even in the nitride semiconductor laser device according to the present invention.

(As to Longitudinal Direction of Groove)

The longitudinal direction of grooves formed on a nitride semiconductor substrate having a main surface of a {0001} C-plane is most preferably parallel to a <1-100> direction, and next-preferably parallel to a <11-20> direction. The longitudinal direction of the grooves related to such specific directions is not substantially influenced by a deviation angle of about ±5° in the {0001} C-plane.

The preference of formation of the grooves along the <1-100> direction of the nitride semiconductor substrate resides in extremely large effects of relaxing crystal strain and suppressing cracking. When a nitride semiconductor film is grown in grooves formed along this direction, a {11-20} plane mainly grows on the side wall surfaces of the grooves, which in turn are covered with the nitride semiconductor film. The {11-20} plane is perpendicular to the main surface of the substrate, and hence the grooves are covered with the nitride semiconductor film while presenting substantially rectangular cross sections. In other words, the nitride semiconductor film hardly grows on the bottom surfaces of the grooves, which in turn are covered from the side walls thereof. The nitride semiconductor film attains sufficient growth in a direction parallel to the main surface of the substrate (hereinafter referred to as lateral growth), to conceivably bring the very large effects of relaxing crystal strain and suppressing cracking. When the nitride semiconductor film hardly grows on the bottom surfaces of the grooves, the lateral growth is promoted keeping a large depth of the grooves (close to the depth of grooves formed on a worked substrate), while the grooves being covered with the lateral growth, to preferably increase the crystal area having the effects of relaxing crystal strain and suppressing cracking.

Further, the aforementioned specific longitudinal direction of the grooves can increase the lateral growth in combination with the groove width G within the groove-land width range A, thereby more efficiently attaining the effects of relaxing crystal strain and suppressing cracking.

On the other hand, the preference of formation of grooves along the <11-20> direction of the nitride semiconductor device resides in that the nitride semiconductor film filling up the grooves exhibits good surface morphology on areas located on the grooves. When the nitride semiconductor film grows in the grooves formed along this direction, a {1-101} plane mainly grows on the side wall surfaces of the grooves, which in turn are covered with the nitride semiconductor film. The {1-101} side wall surfaces are extremely flat, and edge portions where the side wall surfaces are in contact with upper surfaces of lands are very sharp. Therefore, the grooves formed along the <11-20> direction are covered with the nitride semiconductor film in a hardly meandering state as viewed from above, as shown in FIG. 2B. The nitride semiconductor film exhibits excellent surface morphology on the areas located on the grooves covered in such a manner. When an underlayer consisting of the nitride semiconductor film has excellent surface morphology, the defective ratio of nitride semiconductor light emitting devices formed on the underlayer is preferably reduced.

While all of the aforementioned grooves or lands are striped, the striped shape is preferable in the following point. When a part (below a ridge stripe portion) contributing to oscillation of a nitride semiconductor laser device is striped and the aforementioned preferable area (the area I or II) for forming the ridge stripe portion is also striped, the part contributing to oscillation can be readily formed on the preferable area I or II. Alternatively, cross-striped grooves may be formed as shown in FIGS. 4A to 4C, in place of the striped grooves or lands.

Figure 4A:
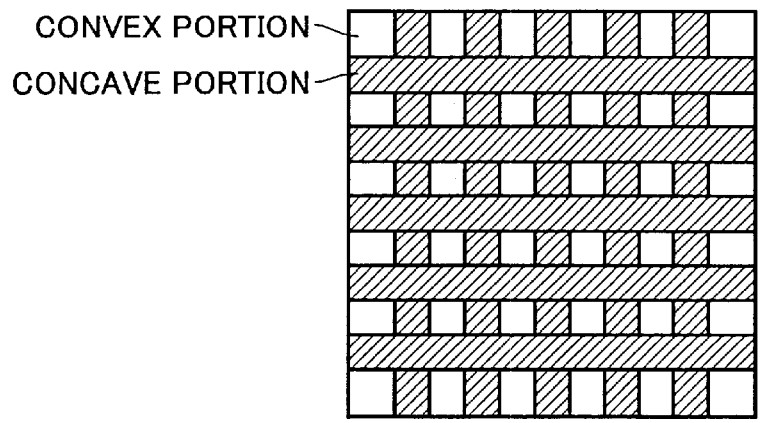
FIG. 4A illustrates grooves having two types of directions perpendicular to each other in relation to modes of grooves (concave portions) and lands (convex portions) formed on the worked substrate employable in the present invention.
Figure 4B:
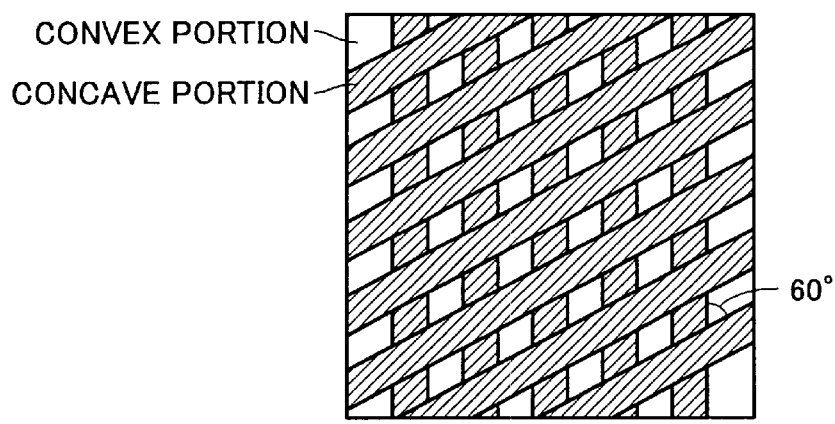
FIG. 4B illustrates grooves having two types of directions intersecting with each other at an angle of 60°.
Figure 4C:
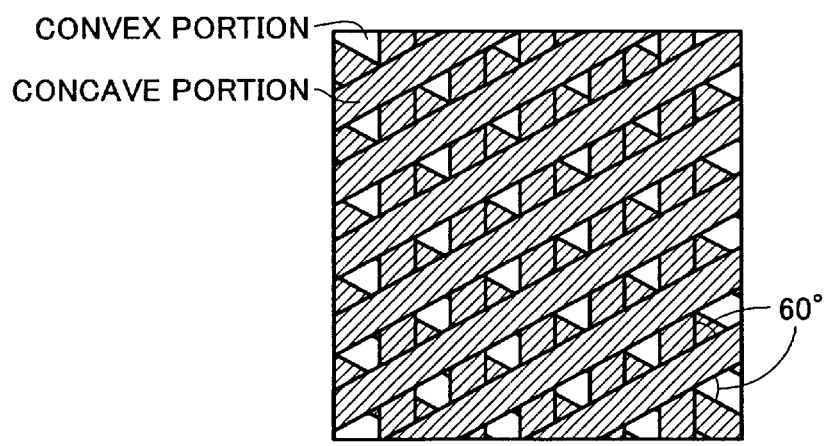
FIG. 4C illustrates grooves having three types of directions intersecting with each other at an angle of 60°.

FIG. 4A is a top plan view of a worked substrate, formed with two different types of grooves perpendicular to each other, having concave and convex portions. FIG. 4B is a top plan view of a worked substrate, formed with two different types of grooves intersecting with each other at an angle of 60°, having concave and convex portions. FIG. 4C is a top plan view of a worked substrate, formed with three different types of grooves intersecting with each other at an angle of 60°, having concave and convex portions.

(As to Nitride Semiconductor Underlayer)

The underlayer consisting of a nitride semiconductor film for covering the worked substrate can be formed by a GaN film, an AlGaN film or an InGaN film, for example.

A nitride semiconductor underlayer of a GaN film is preferable in the following points: The GaN film of a binary mixed crystal has excellent controllability for crystal growth. Further, the surface migration length of the GaN film is larger than that of an AlGaN film and smaller than that of an InGaN, and hence proper lateral growth can be attained to completely and flatly cover grooves and lands.

A nitride semiconductor underlayer of an AlGaN film is preferable in the following points: The AlGaN film containing Al has a smaller surface migration length as compared with a GaN film and an InGaN film. The nitride semiconductor film having a small surface migration length is hardly deposited on the bottom portions of the grooves while laterally covering the grooves. In other words, crystal growth of the AlGaN film is promoted from the side walls of the grooves to remarkably present lateral growth, to be capable of further relaxing crystal strain. The composition ratio x of Al contained in an $Al_xGa_{1-x}N$ film is preferably at least 0.01 and not more than 0.15, and more preferably at least 0.01 and not more than 0.07. If the composition ratio x of Al is smaller than 0.01, the aforementioned surface migration length may be undesirably increased. If the composition ratio x of Al exceeds 0.15, the surface migration length may be so excessively reduced that the grooves are hardly flatly filled up with the underlayer. An effect similar to that of the AlGaN film can be attained so far as the nitride semiconductor underlayer contains Al.

A nitride semiconductor underlayer of an InGaN film is preferable in the following points. The InGaN film containing In is more elastic as compared with a GaN film and an AlGaN film. Therefore, the InGaN film fills up the grooves of the worked substrate to diffuse crystal strain from the nitride semiconductor substrate over the nitride semiconductor film and relax difference in strain between the areas located on the grooves and the lands. The In composition ratio x in an $In_xGa_{1-x}N$ film is preferably at least 0.01 and not more than 0.18, and more preferably at least 0.01 and not more than 0.1. If the In composition ratio x is smaller than 0.01, the effect of elasticity due to In may be hardly attained. If the In composition ratio x exceeds 0.18, crystallinity of the InGaN film may be reduced. An effect similar to that of the InGaN film can be attained so far as the nitride semiconductor underlayer contains In.

(As to Thickness of Nitride Semiconductor Underlayer)

In order to completely cover the worked substrate, the nitride semiconductor film forming the underlayer must have a sufficient thickness. In order not to completely cover the worked substrate, the nitride semiconductor film forming the underlayer must have a small thickness. In order to solve problems related to the present invention, the worked substrate need not necessarily be covered completely with the nitride semiconductor film. In consideration of the acquisition ratio of a light emitting device chip, however, the worked substrate is preferably covered completely with the nitride semiconductor underlayer. Therefore, the thickness of the nitride semiconductor film is preferably about at least 2 μm and not more than 20 μm. If the thickness of the nitride semiconductor film is smaller than 2 μm, it starts to be difficult to completely and flatly fill up the grooves with the nitride semiconductor film, depending on the width and the depth of the grooves formed on the worked substrate. If the thickness of the nitride semiconductor film is larger than 20 μm, vertical growth (perpendicular to the main surface of the substrate) on the worked substrate may gradually become remarkable as compared with lateral growth, leading to a possibility of insufficient effects of relaxing crystal strain and suppressing cracking.

(As to Method of Verifying Worked substrate)

In order to confirm whether or not a covered worked substrate includes a worked substrate having the groove width G and the land width L according to the present invention in a nitride semiconductor light emitting device including a light emitting device structure grown on the covered worked substrate, the light emitting device structure may be partially or entirely ground with an apparatus such as a grinder and the device may be observed with a cathode luminescence (CL) device. According to a result of CL measurement made by the inventors, grooves formed on a nitride semiconductor substrate (worked substrate) were observed as a pattern of bright and dark stripes. The bright and dark stripes corresponded to grooves and lands formed on the worked substrate, and it was possible to measure the widths of the grooves and the lands formed on the worked substrate by measuring the widths of the stripes. According to a result of deep study made by the inventors, the bright stripes corresponded to the grooves, and the dark stripes corresponded to the lands.

In place of partially or entirely grinding the light emitting device structure with an apparatus such as a grinder, the substrate of the nitride semiconductor light emitting device may be partially ground with an apparatus such as a grinder. When the ground surface of the device is observed with a CL device, a result of observation similar to the above can be obtained.

[Second Embodiment]

A method of preparing a covered worked substrate according to a second embodiment of the present invention is described with reference to FIG. 3. Items not particularly mentioned in relation to this embodiment are similar to those of the first embodiment.

Figure 3:
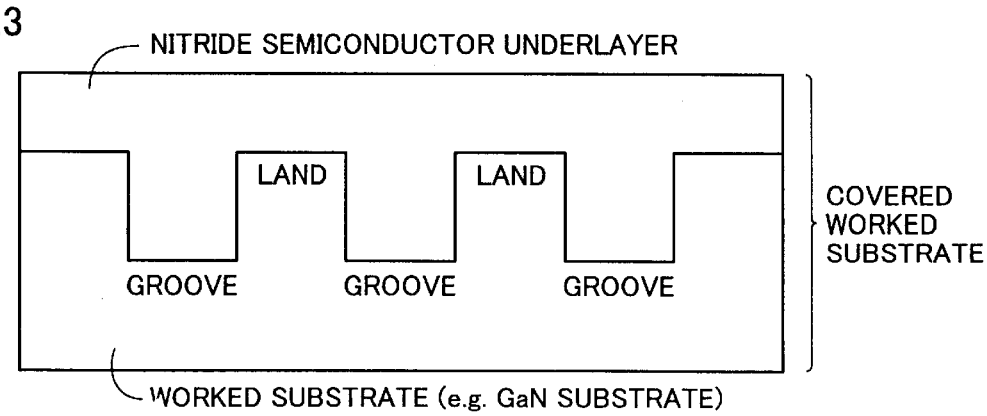
FIG. 3 is a schematic sectional view showing an exemplary covered worked substrate employable in the present invention.

FIG. 3 is a schematic sectional view showing a covered worked substrate covered with an underlayer of a nitride semiconductor film, which can be prepared as follows. A dielectric film of $SiO_2$ or $SiN_x$ is first deposited on the main surface, oriented along the (0001) plane, of an n-type GaN substrate. A general resist material is applied onto this dielectric film for forming a striped mask pattern by lithography. Along this mask pattern, grooves are formed on the n-type GaN substrate through the dielectric film by dry etching. Thereafter the resist material and the dielectric film are removed for preparing a worked substrate. The grooves and lands formed in the aforementioned manner along the <1-100> direction of the n-type GaN substrate present a groove width of 17 µm, a groove depth of 3 µm and a land width of 8 µm. Alternatively, a low-temperature GaN buffer layer may be formed on the n-type GaN substrate having the main surface oriented along the (0001) plane at a relatively low temperature of about 450 to 600° C., in order to form an n-type GaN layer on the low-temperature GaN buffer layer and thereafter prepare a worked substrate by the aforementioned method.

The prepared worked substrate is subjected to sufficient organic cleaning and thereafter introduced into an MOCVD (metal-organic chemical vapor deposition) apparatus for stacking an underlayer consisting of a GaN film having a thickness of 6 µm thereon. In order to form the GaN underlayer, $NH_3$ (ammonia) as a source for a group V element and TMGa (trimethyl gallium) or TEGa (triethyl gallium) as a source for a group III element are supplied onto the worked substrate set in the MOCVD apparatus, and $SiH_4$ (Si impurity concentration: $1 \times 10^{18}/cm^3$) is added to the source materials at crystal growth temperature of 1050° C. Under such growth conditions, portions located on the grooves and the lands are flatly covered with the underlayer of the GaN film, as shown in FIG. 3.

In order to form the grooves and the lands on the nitride semiconductor substrate, a general resist material may be directly applied to the surface of the nitride semiconductor substrate without through the aforementioned dielectric film, followed by a process similar to the above. According to an experiment made by the inventors, however, damage (particularly on the surfaces of the lands) on the substrate was preferably reduced during formation of the grooves in the case that the resist material was applied through the dielectric film.

In this embodiment, the low-temperature GaN buffer layer may be a low-temperature $Al_xGa_{1-x}N$ buffer layer ($0 \leq x \leq 1$), or the low-temperature buffer layer may be omitted. However, a currently supplied GaN substrate is not sufficiently preferable in surface morphology, and hence the low-temperature $Al_xGa_{1-x}N$ buffer layer is preferably inserted in consideration of improvement of the surface morphology. The term "low-temperature buffer layer" stands for a buffer layer formed at a growth temperature of about 450 to 600° C., as hereinabove described. A buffer layer formed in such a relatively low growth temperature range is polycrystalline or amorphous.

The grooves, formed by dry etching in this embodiment, may alternatively be formed by another method. For example, wet etching, scribing, wire sawing, electric discharge machining, sputtering, laser beam machining, sandblasting, focus ion beam machining or the like is employable.

The grooves, formed along the <1-100> direction of the n-type GaN substrate in this embodiment, may alternatively be formed along the <11-20> direction.

While the GaN substrate has the main surface along the (0001) plane in this embodiment, another surface orientation or another nitride semiconductor substrate may alternatively be employed. As to the surface orientation of the nitride semiconductor substrate, the C-plane {0001}, the A-plane {11-20}, the R-plane {1-102}, the M-plane {1-100} or the {1-101} plane is preferably employable. A substrate having a main surface at an off angle within 2° from such surface orientation has good surface morphology.

As to the width and the depth of the grooves formed on the worked substrate and the width of the lands in this embodiment, other numerical values may be employed so far as the same satisfy the conditions for the numerical ranges described above with reference to the first embodiment. This also applies to the remaining embodiments.

[Third Embodiment]

A third embodiment of the present invention is similar to the first and second embodiments except that the widths of lands formed on a worked substrate are set not to a constant value but to various different values.

Figure 9:
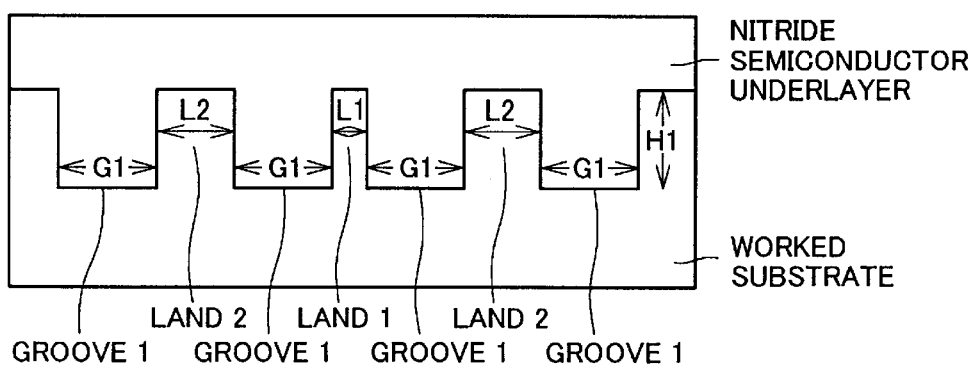
FIG. 9 is a schematic sectional view showing another exemplary covered worked substrate employable in the present invention.

FIG. 9 is a schematic sectional view showing a covered worked substrate according to this embodiment, which has a groove width G1 of 15 µm, a groove depth H1 of 2.5 µm and land widths L1 and L2 of 5 µm and 10 µm respectively. An AlGaN film having a thickness of 5 µm is stacked on this worked substrate, to prepare the covered worked substrate according to the third embodiment.

While the worked substrate according to this embodiment has two types of different land widths, the worked substrate may alternatively have more different land widths.

[Fourth Embodiment]

A fourth embodiment of the present invention is similar to the first and second embodiments except that the widths of grooves formed on a worked substrate are set not to a constant value but to various different values.

Figure 10:
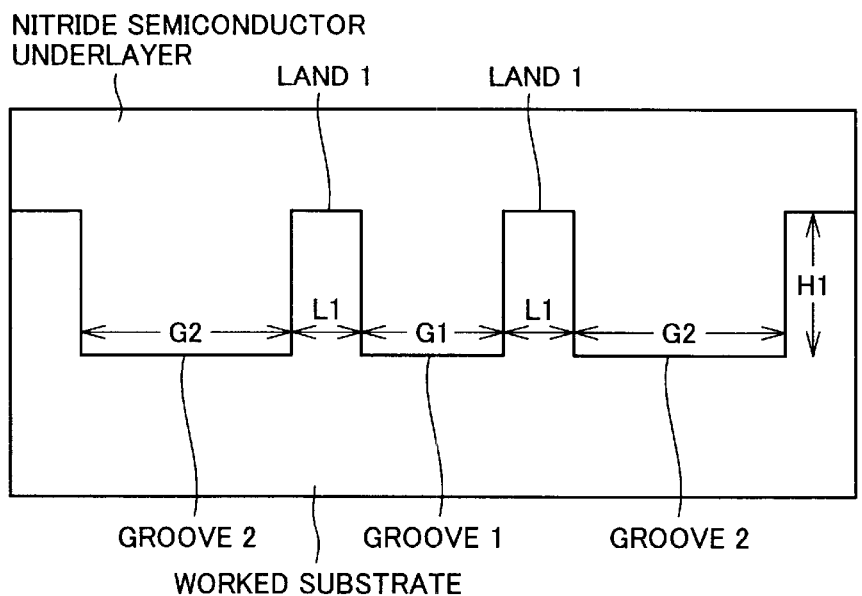
FIG. 10 is a schematic sectional view showing still another exemplary covered worked substrate employable in the present invention.

FIG. 10 is a schematic sectional view showing a covered worked substrate according to this embodiment, which has a land width L1 of 5 µm, a groove depth H1 of 1 µm and groove widths G1 and G2 of 11 µm and 20 µm respectively. An InGaN film having a thickness of 3.5 µm is stacked on this worked substrate, to prepare the covered worked substrate according to the fourth embodiment.

While the worked substrate according to this embodiment has two types of different groove widths, the worked substrate may alternatively have more different groove widths. Further, the fourth embodiment may be combined with the third embodiment.

[Fifth Embodiment]

A fifth embodiment of the present invention is similar to the first and second embodiments except that the depths of grooves formed on a worked substrate are set not to a constant value but to various different values.

Figure 11:
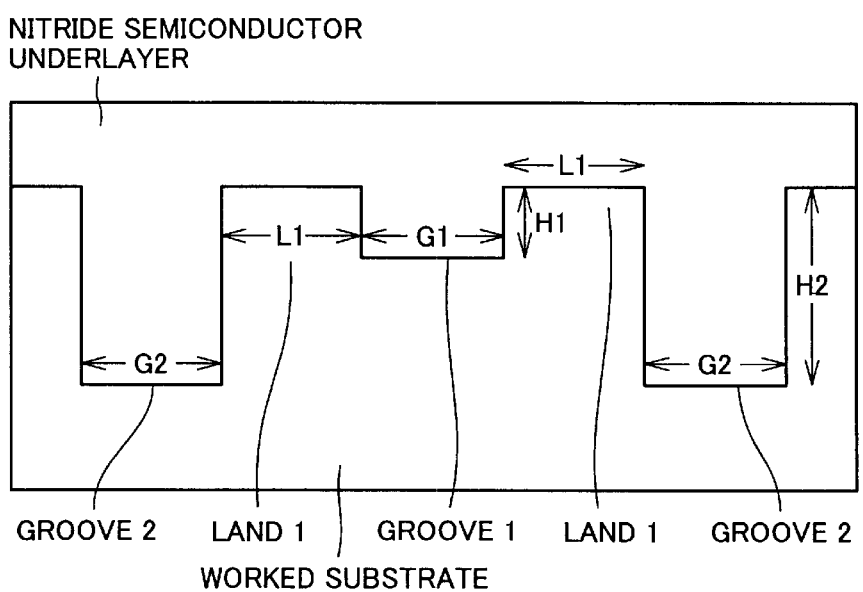
FIG. 11 is a schematic sectional view showing a further exemplary covered worked substrate employable in the present invention.

FIG. 11 is a schematic sectional view showing a covered worked substrate according to this embodiment, which has a groove width G1 of 18 µm, a land width L1 of 7 µm and groove depths H1 and H2 of 1.5 µm and 5 µm respectively. A GaN film having a thickness of 6 µm is stacked on this worked substrate, to prepare the covered worked substrate according to the fifth embodiment.

While the worked substrate according to this embodiment has two types of different groove depths, the worked substrate may alternatively have more different groove depths. Further, the fifth embodiment may be combined with the third or fourth embodiment.

[Sixth Embodiment]

According to a sixth embodiment of the present invention, a nitride semiconductor laser device is formed on the covered worked substrate of any of the first to fifth embodiments.

(Crystal Growth)

Figure 1:
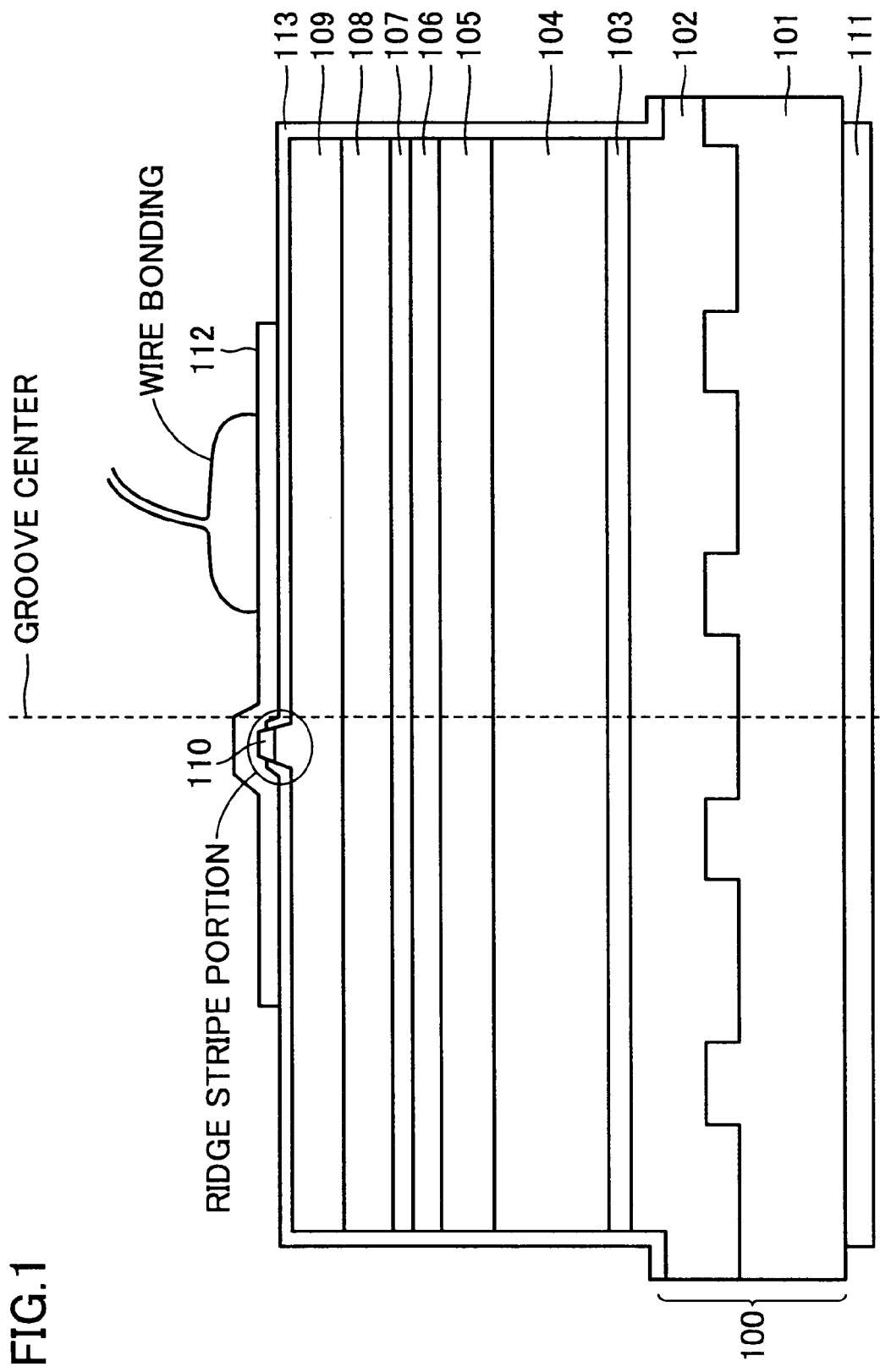
FIG. 1 is a schematic sectional view showing an exemplary nitride semiconductor laser device formed on a covered worked substrate according to the present invention.

FIG. 1 illustrates a nitride semiconductor laser device grown on a covered worked substrate. The nitride semiconductor laser device shown in FIG. 1 includes a covered worked substrate 100 consisting of a worked substrate (n-type GaN substrate) 101 and an n-type $Al_{0.05}Ga_{0.95}N$ underlayer 102, an n-type $In_{0.07}Ga_{0.93}N$ anti-cracking layer 103, an n-type $Al_{0.1}Ga_{0.9}N$ cladding layer 104, an n-type GaN light guide layer 105, an emission layer 106, a p-type $Al_{0.2}Ga_{0.8}N$ carrier blocking layer 107, a p-type GaN light guide layer 108, a p-type $Al_{0.1}Ga_{0.9}N$ cladding layer 109, a p-type GaN contact layer 110, an n electrode 111, a p electrode 112 and an $SiO_2$ dielectric film 113.

In order to prepare this nitride semiconductor laser device, the covered worked substrate 100 according to any of the first to fifth embodiments is first formed. In the sixth embodiment, grooves are formed along the <1-100> direction of the GaN substrate.

Then, TMIn (trimethyl indium) as a source for a group III element and $SiH_4$ (silane) as an impurity are added to $NH_3$ (ammonia) as a source for a group V element and TMGa (trimethyl gallium) or TEGa (triethyl gallium) as a source for a group III element over the covered worked substrate 100 in an MOCVD apparatus, and the n-type $In_{0.07}Ga_{0.93}N$ anti-cracking layer 103 is grown in a thickness of 40 nm at a crystal growth temperature of 800° C. Then, the substrate temperature is increased to 1050° C., for growing the n-type $Al_{0.1}Ga_{0.9}N$ cladding layer 104 (Si impurity concentration: $1 \times 10^{18}/cm^3$) of 0.8 μm thickness by using TMAl (trimethyl aluminum) or TEAl (triethyl aluminum) as a source for a group III element and then growing the n-type GaN light guide layer 105 (Si impurity concentration: $1 \times 10^{18}/cm^3$) of 0.1 μm thickness.

Thereafter the substrate temperature is reduced to 800° C. for forming the emission layer (multiple quantum well structure) 106 by alternately stacking $In_{0.01}Ga_{0.99}N$ barrier layers of 8 nm thickness and $In_{0.15}Ga_{0.85}N$ well layers of 4 nm thickness. According to this embodiment, the emission layer 106 has a multiple quantum well structure starting and ending with barrier layers, and includes three (three cycles of) quantum well layers. An Si impurity is added to both of the barrier layers and the well layers in a concentration of $1 \times 10^{18}/cm^3$. A crystal growth interruption interval of at least 1 second and not more than 180 seconds may be inserted between any barrier layer growth and the next well layer growth or between any well layer growth and the next barrier layer growth. In this case, the layers are preferably improved in flatness to reduce the half-width of an emission spectrum.

$AsH_3$ or TBAs (tertiary butyl arsine) may be employed when As is added to the emission layer 106, $PH_3$ or TBP (tertiary butyl phosphine) may be employed when P is added to the emission layer 106, and TMSb (trimethyl antimony) or TESb (triethyl antimony) may be employed when Sb is added to the emission layer 106. Alternatively, $N_2H_4$ (dimethyl hydrazine) may be employed in place of $NH_3$ as a source for N when the emission layer 106 is formed.

Then, the substrate temperature is increased to 1050° C. again, for successively growing the p-type $Al_{0.2}Ga_{0.8}N$ carrier blocking layer 107 of 20 nm thickness, the p-type GaN light guide layer 108 of 0.1 μm thickness, the p-type $Al_{0.1}Ga_{0.9}N$ cladding layer 109 of 0.5 μm thickness and the p-type GaN contact layer 110 of 0.1 μm thickness. As a p-type impurity, Mg ($EtCP_2Mg$: bisethyl cyclopentadienyl magnesium) is added in a concentration of $5 \times 10^{19}/cm^3$ to $2 \times 10^{20}/cm^3$. The p-type impurity concentration in the p-type GaN contact layer 110 is preferably increased toward the interface between the same and the p electrode 112. Thus, contact resistance is reduced at the interface between the p-type GaN contact layer 110 and the p electrode 112. Further, a small amount of oxygen may be introduced during growth of the p-type layers, in order to remove residual hydrogen that inactivates Mg not to serve as the p-type impurity.

After the aforementioned growth of the p-type GaN contact layer 110, gas in a reactor of the MOCVD apparatus is entirely replaced with nitrogen carrier gas and $NH_3$, and the substrate is cooled at a rate of 60° C./min. When the substrate temperature reaches 800° C., supply of $NH_3$ is stopped and the substrate is held at this temperature for five minutes and thereafter cooled to the room temperature. The substrate is preferably held at a temperature between 650° C. and 900° C. for at least 3 minutes and not more than 10 minutes. The rate of cooling the substrate to the room temperature is preferably at least 30° C./min. In actual evaluation by Raman measurement, a crystal-grown film formed in the aforementioned manner already exhibited p-type characteristics (i.e., Mg was activated) in a state not subjected to conventional annealing for attaining p-type conductivity. Further, contact resistance was also reduced in formation of the p electrode 112. When the conventional annealing for attaining p-type conductivity was additionally introduced, the activation ratio of Mg was further preferably improved.

In this embodiment, the layers needed to be formed from the worked substrate 101 up to the nitride semiconductor laser device may be continuously crystal-grown, or growth process from the worked substrate 101 to the covered worked substrate 100 may be carried out in advance so that re-growth is thereafter performed to form the nitride semiconductor laser device.

In this embodiment, the $In_{0.07}Ga_{0.93}N$ anti-cracking layer 103 may alternatively have an In composition ratio other than 0.07, or may be omitted. When lattice mismatch between the cladding layer 104 and the GaN substrate 101 is increased, the InGaN anti-cracking layer 103 is preferably inserted.

The emission layer 106, starting and ending with the barrier layers in this embodiment, may alternatively start and end with well layers. The number of the well layers included in the emission layer 106 is not restricted to three. So far as the number of the well layers is not more than 10, the value of the threshold current is low allowing continuous oscillation at the room temperature. The value of the threshold current is preferably reduced particularly when the number of the well layers is at least 2 and not more than 6.

Si, added to both of the well layers and the barrier layers in the concentration of $1 \times 10^{18}/cm^3$ in the emission layer 106 according to this embodiment, is not necessarily to be added. However, emission intensity is increased when Si is added to the emission layer 106. The impurity added to the emission layer 106 is not restricted to Si but at least any of O, C, Ge, Zn and Mg may alternatively be employed. The total amount of the impurity is preferably about $1 \times 10^{17}/cm^3$ to $1 \times 10^{19}/cm^3$. Further, the impurity may not be added to both of the well layers and the barrier layers but may alternatively be added to only either the well layers or the barrier layers.

According to this embodiment, the p-type $Al_{0.2}Ga_{0.8}N$ carrier blocking layer 107 may alternatively have an Al composition ratio other than 0.2, or may be omitted. However, the value of the threshold current is reduced when the carrier blocking layer 107 is provided. This is because the carrier blocking layer 107 confines carriers in the emission layer 106. The Al composition ratio of the carrier blocking layer 107 may preferably be increased in order to strengthen confinement of the criers. Further, the Al composition ratio may preferably be reduced within a range for maintaining confinement of the carriers, in order to increase carrier mobility in the carrier blocking layer 107 and reduce electrical resistance.

The Al composition ratio of $Al_{0.1}Ga_{0.9}N$ employed for the p-type cladding layer 109 and the n-type cladding layer 104 in this embodiment may be other than 0.1. If the Al ratio in the mixed crystal is increased, energy gap difference and refractive index difference between the cladding layers 109 and 104 and the emission layer 106 are increased so that the carriers and light are efficiently confined in the emission layer 106 and the value of the laser oscillation threshold current can be reduced. If the Al composition ratio is reduced in a range for maintaining confinement of the carriers and light, carrier mobility in the cladding layers 109 and 104 is so increased that an operating voltage of the device can be reduced.

The thickness of each of the AlGaN cladding layers 109 and 104 is preferably within the range of 0.7 $\mu$m to 1.0 $\mu$m, in order to attain a unimodal vertical lateral mode, increase light confinement efficiency, improve optical characteristics of the laser device and reduce the value of the laser threshold current.

The cladding layers 109 and 104 are not restricted to ternary mixed crystals of AlGaN but may be quaternary mixed crystals of AlInGaN, AlGaNP or AlGaNAs. Further, the p-type cladding layer 109 may have a superlattice structure including a p-type AlGaN layer and a p-type GaN layer or including a p-type AlGaN layer and a p-type InGaN layer, in order to reduce electrical resistance.

While an MOCVD apparatus is employed for crystal growth in this embodiment, it may alternatively be performed by molecular beam epitaxy (MBE), hydride vapor phase epitaxy (HVPE) or the like.

(Chip Step)

An epi-wafer (a wafer including nitride semiconductor layers epitaxially grown on a covered worked substrate) formed by the aforementioned crystal growth is taken out from the MOCVD apparatus and processed into a laser device. The epi-wafer formed with a nitride semiconductor laser layer has a flat surface, i.e., grooves and lands formed on the worked substrate 101 are completely filled up with a nitride semiconductor underlayer and a light emitting device structure layer.

Hf and Al are successively stacked to form the n electrode 111 on the rear surface the covered worked substrate 100 consisting of an n-type nitride semiconductor (see FIG. 1). Alternatively, Ti and Al, Ti and Mo, or Hf and Au may be stacked to form then electrode 111. Hf is preferably employed for the n electrode 111, to reduce the contact resistance thereof.

The p electrode is etched in a striped manner along the grooves of the worked substrate 101, thereby forming a ridge stripe portion (see FIG. 1). When cross-striped grooves are formed on the worked substrate 101, the <1-100> and <11-20> directions of the nitride semiconductor substrate may be selected as the longitudinal directions of these grooves. The ridge stripe portion, having a stripe width W of 2.0 $\mu$m, is formed to be included in the aforementioned area I. Thereafter the $SiO_2$ dielectric film 113 is deposited and the upper surface of the p-type GaN contact layer 110 is exposed from the $SiO_2$ dielectric film 113 so that Pd, Mo and Au are deposited thereon for forming the p electrode 112. Alternatively, Pd, Pt and Au, Pd and Au, or Ni and Au may be stacked to form the p electrode 112.

Finally, the epi-wafer is cloven perpendicularly to the longitudinal direction of the ridge stripe portion, to prepare a Fabry-Pérot resonator having a resonator length of 500 $\mu$m. The resonator length is preferably within the range of 300 $\mu$m to 1000 $\mu$m in general. The resonator formed along the grooves in the <1-100> direction has a mirror end surface defined by the M plane {1-100} of a nitride semiconductor crystal. In order to form this mirror end surface, cleavage and division for a laser chip are carried out from the rear surface of the covered worked substrate 100 with a scriber. However, cleavage is performed not after scribing the wafer across the overall rear surface thereof but after partially scribing the wafer only on both ends thereof. Thus, no shavings resulting from the scribing and the sharp edge of the end surface adhere to the surface of the epi-wafer, whereby the yield of the device is improved.

The laser resonator may also adopt a feed-back system generally known as DFB (distribution feedback) or DBR (distribution Bragg reflection) or the like.

Dielectric films of $SiO_2$ and $TiO_2$ are alternately deposited on the mirror end surface of the Fabry-Pérot resonator to form a dielectric multilayer reflection film having reflectance of 70%. Alternatively, a multilayer film of $SiO_2/Al_2O_3$ or the like may be employed for the dielectric multilayer reflection film.

While the n electrode 111 is formed on the rear surface of the covered worked substrate 100, the n-type $Al_{0.05}Ga_{0.95}N$ film 102 may be partially exposed from the front side of the epi-wafer so that the n electrode is formed on the exposed area.

(Packaging)

The semiconductor laser device chip obtained in the aforementioned manner is packaged. When a nitride semiconductor laser device having a high output (at least 30 mW) is employed, attention must be drawn to measures for heat radiation. While the high-output nitride semiconductor laser device can be connected to the body of a package by an In solder material with its semiconductor junction being upward or downward, it is preferably connected to the body of the package with its semiconductor junction being downward. While the high-output nitride semiconductor laser device can be directly mounted on the body of the package or a heat sink part, it may be connected through a submount of Si, AlN, diamond, Mo, CuW, BN, Fe, Cu, SiC or Au.

The nitride semiconductor laser device according to this embodiment is prepared in the aforementioned manner.

While the worked substrate 100 of GaN is employed in this embodiment, a worked substrate of another nitride semiconductor may alternatively be employed. In the case of a nitride semiconductor laser device, for example, a layer having a lower refractive index than a cladding layer must be in contact with the outer side of the cladding layer in order to attain a unimodal vertical lateral mode, and thus an AlGaN substrate can be preferably employed.

According to this embodiment, the nitride semiconductor laser device is formed on the covered worked substrate 100, thereby to relax crystal strain, suppress cracking, obtain a laser oscillation life of about 15500 hours and improve a device yield due to the effect of suppressing cracking.

[Seventh Embodiment]

In a seventh embodiment of the present invention, a nitride semiconductor light emitting diode device is formed on any covered worked substrate obtained in the first to fifth embodiments. At this time, a nitride semiconductor light emitting diode device layer is formed by a method similar to the prior art.

In the nitride semiconductor light emitting diode device according to this embodiment, emission intensity is improved as compared with the prior art. In particular, a light emitting diode device made of nitride semiconductor material to have a short emission wavelength (not more than 440 nm) or a long emission wavelength (at least 600 nm) can attain emission intensity of at least about 1.6 times as compared with the prior art by forming the same on any covered worked substrate obtained in the first to fifth embodiment.

[Eighth Embodiment]

An eighth embodiment of the present invention is similar to the sixth and seventh embodiments, except that an emission layer contains a substitutional element of at least one of As, P and Sb for substituting for part of N. More specifically, the substitutional element of at least one of As, P and Sb is contained in the emission layer of a nitride semiconductor light emitting device in substitution for part of N contained at least in well layers. Assuming that s represents the total composition ratio of As, P and/or Sb contained in the well layers and y represents the composition ratio of N, the composition ratio x is smaller than the composition ratio y, and x/(x+y) is not more than 0.3 (30%), preferably not more than 0.2 (20%). The lower limit of the preferable total concentration of As, P and/or Sb is at least $1\times10^{18}/cm^3$.

This is because concentration separation causing certain areas of different composition ratios of the substitutional element(s) in the well layers starts to take place when the composition ratio x of the substitutional element(s) exceeds 20%, and then the concentration separation starts to change to crystal system separation causing a hexagonal system and a cubic system in a mixed state when the composition ratio x exceeds 30%, thereby increasing the possibility of reducing crystalline quality of the well layers. When the total concentration x of the substitutional element(s) is reduced below $1\times10^{18}/cm^3$ to the contrary, the effect of introducing the substitutional element(s) into the well layers can be hardly attained.

According to this embodiment, the effective mass of electrons and holes in the well layers is reduced and mobility thereof is increased due to the substitutional element of at least one of As, P and Sb contained in the well layers. In the case of a semiconductor laser device, small effective mass means that carrier inversion distribution for laser oscillation is obtained with a small current injection ratio while large mobility means that new electrons and holes can be injected at a high speed due to diffusion even if electrons and holes disappear in the emission layer due to emission recombination. In other words, a semiconductor laser having lower threshold current density and good self-oscillation characteristic (good low-noise characteristic) can be obtained in this embodiment as compared with an InGaN nitride semiconductor laser device containing none of As, P and Sb in an emission layer. Further, the laser oscillation life generally tends to increase when the threshold current density is reduced, and hence a nitride semiconductor laser device having a longer laser oscillation life can be obtained according to this embodiment.

When this embodiment is applied to a nitride semiconductor light emitting diode, an In composition ratio in well layers can be reduced as compared with a conventional nitride semiconductor light emitting diode device including InGaN well layers by introducing a substitutional element of As, P and/or Sb into well layers. This means that reduction of crystalline quality caused by concentration separation of In can be suppressed. Therefore, the effect attained by adding the substitutional element(s) is multiplied with the effect related to the nitride semiconductor diode device according to the seventh embodiment, so that emission intensity can be further improved and color irregularity can be reduced in addition. Particularly when the light emitting diode device is prepared of nitride semiconductor material to have a short emission wavelength (not more than 440 nm) or a long emission wavelength (at least 600 nm), well layers can be formed with a low In composition ratio or without containing In, whereby smaller color irregularity and larger emission intensity can be attained as compared with the conventional InGaN nitride semiconductor light emitting diode device.

[Ninth Embodiment]

According to a ninth embodiment of the present invention, the nitride semiconductor laser device of the sixth or eighth embodiment is applied to an optical apparatus. A blue-purple nitride semiconductor laser device (oscillation wavelength: 380 to 420 nm) of the sixth or eighth embodiment can be preferably applied to various optical apparatuses, and is applicable to an optical pickup apparatus, for example, preferably in the following point. Such a nitride semiconductor laser device stably operates with a high output in a high-temperature atmosphere and has a long laser oscillation life, and is hence optimum for a highly reliable high-density recording/reproducing optical disk apparatus (recording/reproduction in higher density is enabled as the oscillation wavelength is reduced).

Figure 13:
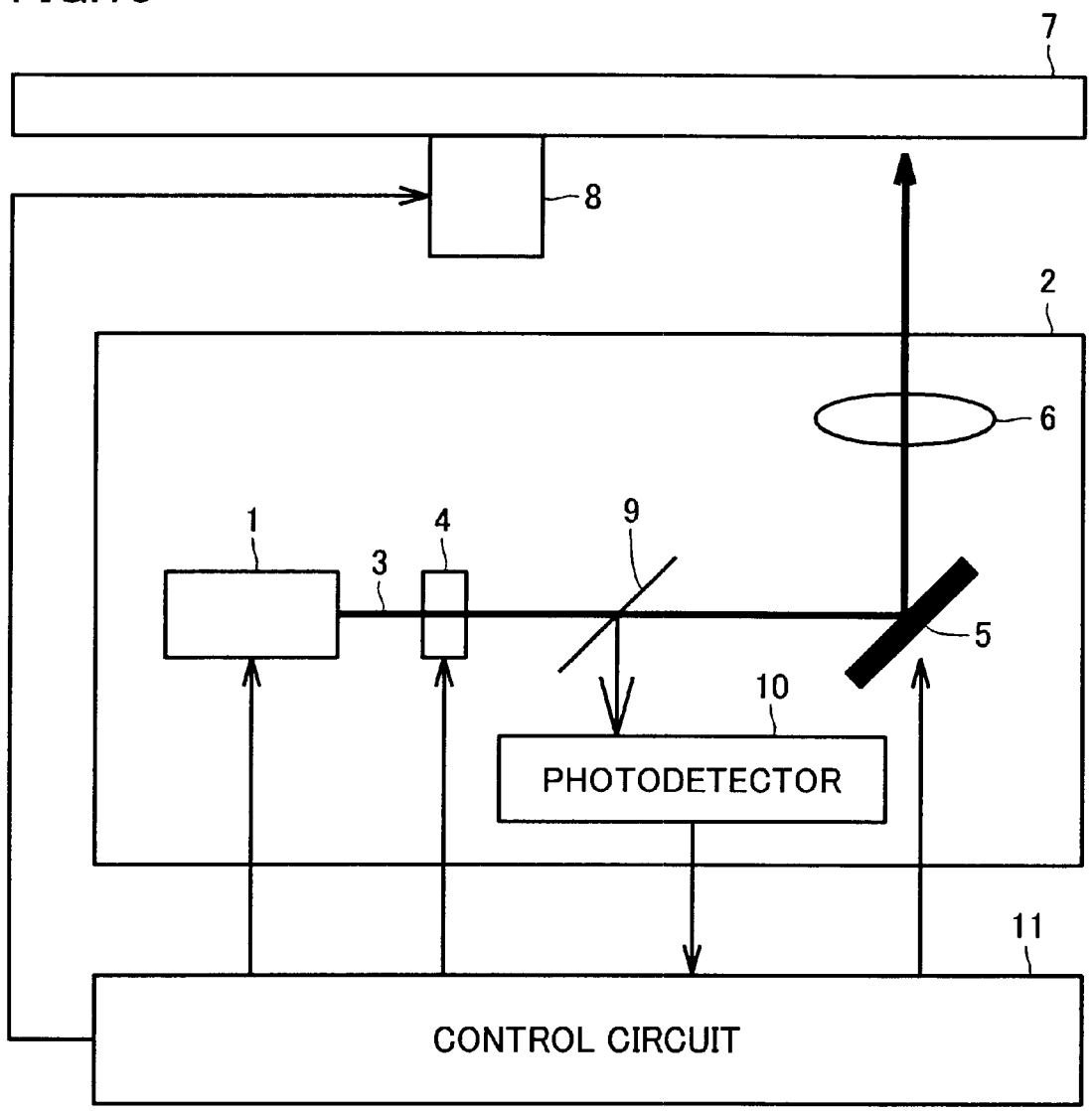
FIG. 13 is a schematic block diagram showing an exemplary optical apparatus including an optical pickup device utilizing the nitride semiconductor laser device according to the present invention.

FIG. 13 is a schematic block diagram showing an exemplary optical disk device such as a DVD including an optical pickup to which a nitride semiconductor laser device of the sixth or eighth embodiment is applied. In this optical information recording/reproducing apparatus, a laser beam 3 outgoing from the nitride semiconductor laser device 1 is modulated by an optical modulator 4 in response to input information. Then the modulated light information is recorded on a disk 7 through a scan mirror 5 and a lens 6. A motor 8 rotates the disk 7. In reproduction, a photodetector 10 detects a reflected laser beam optically modulated by pit arrangement on the disk 7 through a beam splitter 9, thereby obtaining a reproduced signal. A control circuit 11 controls operations of these elements. The laser device 1 generally has an output of 30 mW in recording and about 5 mW in reproduction.

The laser device according to the present invention is applicable not only to the aforementioned optical disk recording/reproducing apparatus but also to a laser printer, a bar code reader, a projector with a laser beam of the three primary colors (blue, green and red).

[Tenth Embodiment]

According to a tenth embodiment of the present invention, the nitride semiconductor light emitting diode device of the seventh or eighth embodiment is applied to a semiconductor light emitting apparatus. The nitride semiconductor light emitting diode device is applicable to a display (exemplary semiconductor light emitting apparatus) as a device for at least one of the three primary colors (red, green and blue). A display having less color irregularity and high emission intensity can be prepared by utilizing such a nitride semiconductor light emitting diode device.

The nitride semiconductor light emitting diode device capable of emitting light of the three primary colors is also applicable to a white light source apparatus. A nitride semiconductor light emitting diode device according to the present invention, having an emission wavelength in the ultraviolet to violet regions (about 360 to 440 nm), is also employable as a white light source device when a fluorescent paint is applied thereto.

When such a white light source is employed, a backlight having low power consumption and high brightness can be implemented in place of a halogen light source employed for a conventional liquid crystal display. This white light source can also be applied as a backlight for a liquid crystal display of a man-machine interface of a portable notebook-sized personal computer or a portable telephone, so that a miniature liquid crystal display having sharp picture quality can be provided.

According to the present invention, as hereinabove described, the emission life and emission intensity can be improved in a nitride semiconductor light emitting device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting device comprising:

a worked substrate including grooves and lands formed on a main surface of a nitride semiconductor substrate;

a nitride semiconductor underlayer covering said grooves and said lands of said worked substrate; and a nitride semiconductor multilayer emission structure including an emission layer including a quantum well layer or both a quantum well layer and a barrier layer in contact with said quantum well layer between an n-type layer and a p-type layer over said nitride semiconductor underlayer, wherein width of said grooves is within the range of 11 to 30 $\mu$m, and width of said lands is within the range of 1 to 20 $\mu$m.

2. The nitride semiconductor light emitting device according to claim 1, wherein the width of said grooves is larger than the width of said lands.

3. The nitride semiconductor light emitting device according to claim 1, wherein depth of said grooves is within the range of 1 to 10 $\mu$m.

4. The nitride semiconductor light emitting device according to claim 1, wherein the longitudinal direction of said grooves or the longitudinal direction of said lands is substantially parallel to a <1-100> direction of a crystal of said substrate.

5. The nitride semiconductor light emitting device according to claim 1, wherein the longitudinal direction of said grooves or the longitudinal direction of said lands is substantially parallel to a <11-20> direction of a crystal of said substrate.

6. The nitride semiconductor light emitting device according to claim 1, wherein said nitride semiconductor underlayer contains Al.

7. The nitride semiconductor light emitting device according to claim 1, wherein said nitride semiconductor underlayer contains $In_xGa_{1-x}N$ ($0.01 \leq x \leq 0.18$).

8. The nitride semiconductor light emitting device according to claim 1, wherein said quantum well layer contains at least any of As, P and Sb.

9. The nitride semiconductor light emitting device according to claim 1, wherein said nitride semiconductor light emitting device is either a laser device or a diode device.

10. An optical apparatus comprising the nitride semiconductor light emitting device according to claim 1.

11. A semiconductor light emitting apparatus comprising the nitride semiconductor light emitting device according to claim 1.

* * * * *